(12) United States Patent
Randall

(10) Patent No.: US 6,245,487 B1
(45) Date of Patent: Jun. 12, 2001

(54) METHODS FOR ENHANCING IMAGES ON RELIEF IMAGE PRINTING PLATES

(75) Inventor: Alvin Varnard Randall, East Point, GA (US)

(73) Assignee: Polyfibron Technologies, Inc., Atlanta, GA (US)

( * ) Notice: Subject to any disclaimer, the term of this patent is extended or adjusted under 35 U.S.C. 154(b) by 0 days.

(21) Appl. No.: 09/383,855

(22) Filed: Aug. 26, 1999

(51) Int. Cl.⁷ ..................................................... G03F 7/004
(52) U.S. Cl. .......................... 430/306; 430/310; 430/325; 430/396
(58) Field of Search ..................................... 430/306, 310, 430/325, 396; 355/71, 78, 113, 125; 362/16, 290, 351

(56) References Cited

U.S. PATENT DOCUMENTS

| | | | |
|---|---|---|---|
| 2,971,083 | * | 2/1961 | Phillips et al. ........................ 240/78 |
| 3,503,681 | * | 3/1970 | Jons et al. .............................. 355/78 |
| 3,795,446 | * | 3/1974 | Houston ................................. 355/78 |
| 3,836,709 | * | 9/1974 | Hutchison ........................ 178/6.7 R |
| 5,147,761 | | 9/1992 | Wessells et al. ..................... 430/306 |
| 5,879,070 | * | 3/1999 | Severloh .............................. 362/125 |

* cited by examiner

Primary Examiner—Hoa Van Le
Assistant Examiner—Barbara Gilmore
(74) Attorney, Agent, or Firm—Woodcock Washburn Kutz Mackiewicz & Norris

(57) ABSTRACT

Methods are provided for producing relief images having improved fidelity and resolution. The methods comprise positioning an image-bearing negative transparency closely adjacent and substantially parallel to a layer of a photocurable material; positioning on the other side of the negative from the photocurable material and in substantially parallel relationship thereto; providing a collimator that has first and second opposing major faces and comprises at least one cell that extends from said first collimator face to said second collimator face and is defined by at least one surface that substantially absorbs actinic radiation incident upon said surface; positioning said collimator opposite a photographic negative that is adjacent a layer of photocurable material; and passing actinic radiation through said collimator for a time sufficient to form a latent relief image in the photocurable material.

26 Claims, 4 Drawing Sheets

METHODS FOR ENHANCING IMAGES ON RELIEF IMAGE PRINTING PLATES

FIELD OF THE INVENTION

The present invention is directed to methods for preparing relief printing plates using photocurable materials. Specifically, this invention relates to the use of an apparatus for improving image fidelity and character geometry of the relief image formed on such plates.

BACKGROUND OF THE INVENTION

Relief image printing plates are widely used for printing on a variety of substrates, including paper, corrugated stock, film, foil, and laminates. Relief plates typically include a support layer and one or more layers of cured photopolymer.

In the manufacture of relief printing plates from photocurable materials, a layer of a liquid or solid material undergoes polymerization, cross-linking, or some other curing reaction upon exposure to actinic radiation, usually ultraviolet light. Typically, the actinic radiation first passes through a photographic negative and then through the photocurable material to selectively cure or harden the material in a pattern corresponding to the image borne by the negative. The negative is typically an image-bearing transparency consisting of substantially opaque and substantially transparent areas. Photocuring takes place in the exposed areas, i.e., those areas of the photocurable layer corresponding positionally to the substantially transparent areas of the negative, and little or no photocuring takes place in the unexposed areas. The photocurable layer can also be exposed from the side opposite the negative. Generally, this "back exposure" is not done in an imagewise manner, and used to form a hardened base for the raised printing indicia formed by the front exposure. The exposed layer is then developed by removal of the unexposed, unhardened portions with an air knife, developer solvent, or other means to form a relief image.

In producing relief images from half-tone negatives, it is often necessary to produce relatively small diameter raised printing indicia in what are otherwise recessed areas of the relief. These areas print the lighter or "highlight" areas of the image, and the raised indicia in these areas are accordingly referred to as "highlight dots". The size and density of highlight dots control shading or tone in the light image areas. Half-tone relief images also generally contain relatively shallow, small diameter depressions in what are otherwise overall raised areas of the relief. These areas print the darker or "shadow" areas of the image and the depressions are generally referred to as "shadow reverses". The size and density of shadow reverses control the tone in the darker image areas.

The production of satisfactory highlight dots and shadow reverses in relief images by photoexposure techniques can present unique problems. Due to the small size of the dots in the half-tone negative used to produce highlight dots, it is generally desired to provide a high-image exposure dose in order to assure both formation of the dots and adequate depthwise curing. Such curing generally is needed to anchor the dot to the image base. Shadow reverses typically form beneath relatively small opaque areas of the negative in an otherwise predominantly transparent area. A high exposure dose can result in exposure of at least a portion of the photocurable material underneath the opaque areas of the photonegative. This translates into a shadow reverse with sloped sides. The result is a distorted printed image.

A high image exposure dose also can result in overexposure in areas beyond dot areas of the half-tone negative. This results in increased dot image area, i.e., a relief dot that is larger than the corresponding transparent area of the negative. In addition, the overexposure results in a higher, broader shoulder profile on the dot. This leads to the printing of smudges and larger-than-intended dots, particularly where there is any over-impression during printing.

Although a lower radiation dose can be used to both lessen the detrimental effects to shadow reverses, as described above, and improve dot shoulder geometry, the lower dose often results in unsatisfactory formation and anchoring of the highlight dots. In addition, it has been observed that the highlight dots generally have a greater tendency to move or otherwise deform during the photoexposure step when lower intensity radiation is used. Such dot movement or deformation is believed to be due, at least in part, to shrinkage of the photocurable material as curing occurs. Dot movement is highly undesirable, resulting in positional displacement of the dot and formation of streaks or tails behind the dot. These streaks or tails becomes part of the relief image and adversely affect the quality of images printed with the plate.

For many photocurable systems, there is no exposure dose which satisfactorily provides both highlight dots and shadow reverses, and the operator is thus forced to make undesired compromises in exposure dose and image quality. For other systems, there can be an exposure dose which provides generally acceptable highlight dots and shadow reverses, but this often occurs in a very narrow "window" of doses, thus attaching a very high degree of criticality to the exposure. The narrow window also means that there is a high risk of error in the exposure step, particularly where there is variability in the intensity of the actinic radiation or in the photoresponse of the photocurable material from one lot to another.

Although the foregoing focuses on the problems with image fidelity and resolution encountered in preparing half-tone relief images, it will be appreciated that similar problems can occur in the formation of other types of high resolution relief images, such as line images. Since the formation of relief images by photoexposure involves an image having not only length and breadth dimensions, but also a substantial and significant depth dimension, unique demands are placed on the photosensitive system and the photoexposure method which are not encountered in those processes and systems used to form only two dimensional images, such as in conventional photographic or photocopying systems.

Previously, there have been attempts to enhance the images formed on relief image printing plates. U.S. Pat. No. 5,147,761, issued Sep. 15, 1992, to Wessells et al. ("the Wessells Patent"), herein incorporated by reference in its entirety, discloses a method for preparing relief image printing plates. The method as described by the Wessells Patent involves positioning a louver, or collimator, having a plurality of open cells having a reflective surface over an image-bearing photographic negative which, in turn, is positioned over a photocurable material. The function of the louver is to reflect and redirect the incident rays of radiant energy towards a more parallel path to the image-bearing photographic negative and the photocurable material. As shown in FIG. 1, however, the reflective surface of the louver still directs the radiant energy, A, at an angle obtuse to the image-bearing photographic negative. The result is a relief image that is distorted from its true size relative to the image on the photographic negative.

Consequently, there remains a need in the art for improved methods of forming relief images by photoexposure.

BRIEF DESCRIPTION OF THE INVENTION

In one embodiment, the present invention provides methods for producing relief images having improved fidelity and resolution, comprising providing a collimator that has first and second opposing major faces and at least one cell that extends from the first collimator face to the second collimator face. The cell wall is defined by at least one surface that substantially absorbs actinic radiation incident upon the surface. The methods of the invention involve the positioning of the collimator opposite a photographic negative that is adjacent a layer of photocurable material, and passing actinic radiation through the collimator for a time sufficient to form a latent relief image in the photocurable material.

Other methods of the present invention comprise providing a collimator that has first and second opposing major faces, at least one cell that extends from the first collimator face to the second collimator face, and is defined by at least one surface comprising a first portion that reflects actinic radiation and a second portion that substantially absorbs actinic radiation incident upon said surface. The methods of the invention involve the positioning of the collimator opposite a photographic negative that is adjacent a layer of photocurable material, and passing actinic radiation through the collimator.

BRIEF DESCRIPTION OF THE DRAWINGS

The numerous objects and advantages of the present invention can be better understood by those skilled in the art by reference to the accompanying non-scale figures, in which.

DETAILED DESCRIPTION OF THE INVENTION

The collimators of the present invention contain at least one cell and, preferably, a plurality of cells. These cells are defined by walls that absorb radiation emitted from an actinic radiation source at severely oblique angles to the plane of the negative. The actinic radiation source can be, for example, a single ultraviolet lamp such as that found in a OLEC OVAC OV45HD (commercially available from Olec Corporation, Irvine, Calif.) or it can be, for example, a plurality of ultraviolet lamps such as that found in a FLEX-LIGHT 3647 Exposure Unit (commercially available from Polyfibron Technologies, Atlanta, Ga.). The cell walls preferably absorb this radiation such that the remaining rays pass through the cells of the collimator in a direction substantially parallel to the negative plane. Radiation that is emitted by the source at more moderate oblique angles, i.e., radiation that does not contact the cell walls, is unaltered by passage through the collimator.

Preferably, the collimator cells are defined by at least one surface. More preferably, the collimator cells are defined by a plurality of surfaces such that the cells are, for example, polygons. Preferably, the number of surfaces defining the cells are from about three to about eight, more preferably from about four to about six, most preferably about four.

The surface of the cells can be flat or they can be curved. Preferably, the surface of the cells is flat. If the surface of the cells is curved, however, it is preferred that the surface is a concave surface having a radius of curvature of about 9 to 13 inches.

The surface of the cell walls must be substantially non-reflective. Non-reflective characteristics can be imparted to the cell walls in a number of ways. The cell walls can be (or coated to be) a color that is radiation absorbing, such as, for example, the color black. Alternatively, the cell walls can be textured, or both coated and textured with a material that inherently absorbs radiation.

Preferably, substantially non-reflective surfaces have minimum reflectivity of about at least 50%, more preferably of at least about 10%, most preferably of about 0%. Reflectivity is determined by a BKY-Gardner Micro-Gloss 60° GB-4510 reflectance measurement unit.

Figure 1:
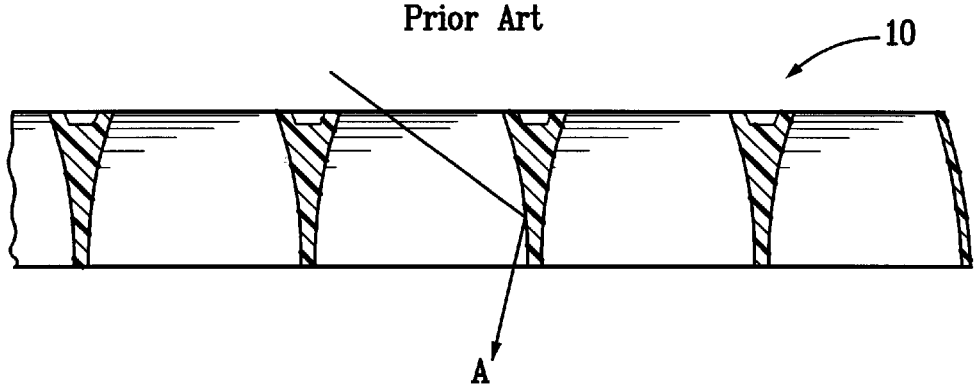
FIG. 1 is a prior art apparatus for preparing relief images on relief image printing plates.
Figure 2:
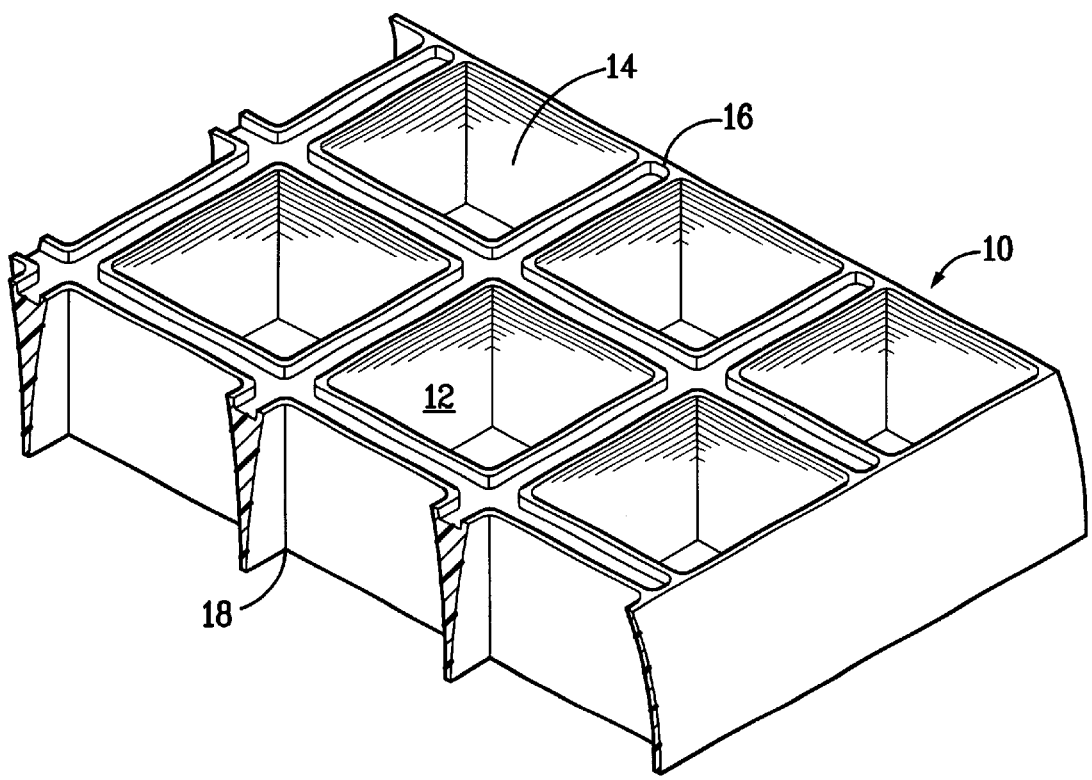
FIG. 2 is a cross-sectional and perspective view of a collimator according to one embodiment of the present invention.

Referring to FIG. 2, there is shown a cross-sectional and perspective view of a preferred collimator 10 having a plurality of cells 12 defined by four flat surfaces 14 extending between first and second opposing major faces 16, 18. The flat surfaces 14 are substantially perpendicular to the first and second opposing major faces 16, 18, and are substantially non-reflective so that they absorb radiation.

Figure 3:
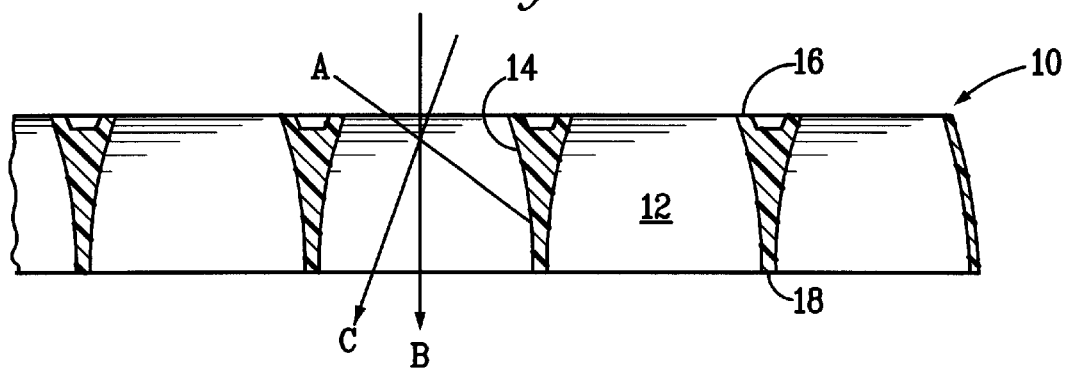
FIG. 3 is a partial cross-sectional view of the collimator shown in FIG. 2 taken along line a—a.

FIG. 3 shows the radiation-absorbing characteristic of collimator 10 in operation. Radiation, depicted by vectors A, B, and C, enters collimator 10 at various angles with respect to a planar surface defined by face 16. Radiation depicted by vector A, at an oblique angle relative to the planar surface defined by face 16, contacts the non-reflective surfaces 14 of cells 12 and is absorbed by surfaces 14. Radiation depicted by vector B, substantially perpendicular to the planar surface defined by face 16, travels through cells 12 without being absorbed by surfaces 14. Likewise, radiation depicted by vector C is depicted as traveling through cells 12, as the angle of its depicted path is not oblique enough to strike surfaces 14.

Figure 4:
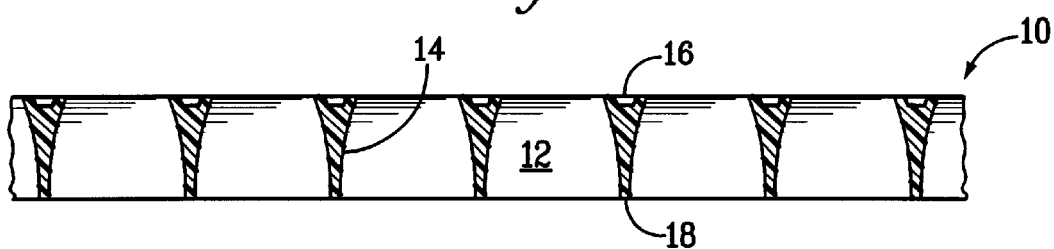
FIG. 4 is a cross-sectional view of another embodiment of a collimator according to the present invention.
Figure 5:
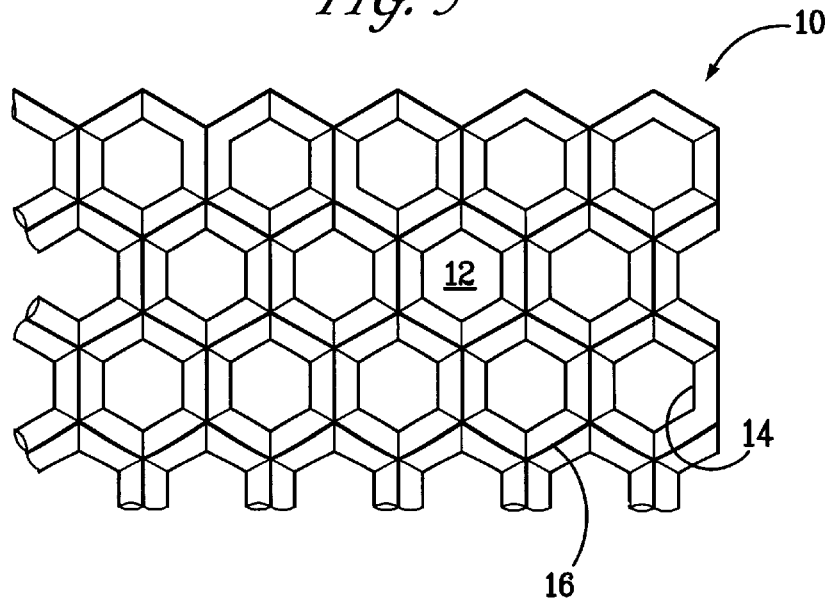
FIG. 5 is a top view of yet another embodiment of a collimator according to the present invention.

FIG. 4 shows a cross-sectional view of another collimator which can be used in accordance with the methods of the present invention. Collimator 10 also has a plurality of cells 12 defined by flat surfaces 14 extending through faces 16, 18. The flat surfaces 14 are substantially non-reflective and wedge shaped. Another collimator is shown in FIG. 5 wherein the cell partitions in cross-section can have the profile of those in FIGS. 2, 3, or 4, but the cell openings are hexagonal in shape.

Collimator cells can vary in diameter from about 5/8 inch on a side to about 4 inches on a side. Preferably, the cell openings are square and range in size from about ¼ inch to 2 inches on a side. The collimators generally have a depth in the range of about ⅝ inch to 3 inches, preferably about ¼ inch to 2 inches. The depth of the collimators generally increases with increasing cell size.

Figure 6:
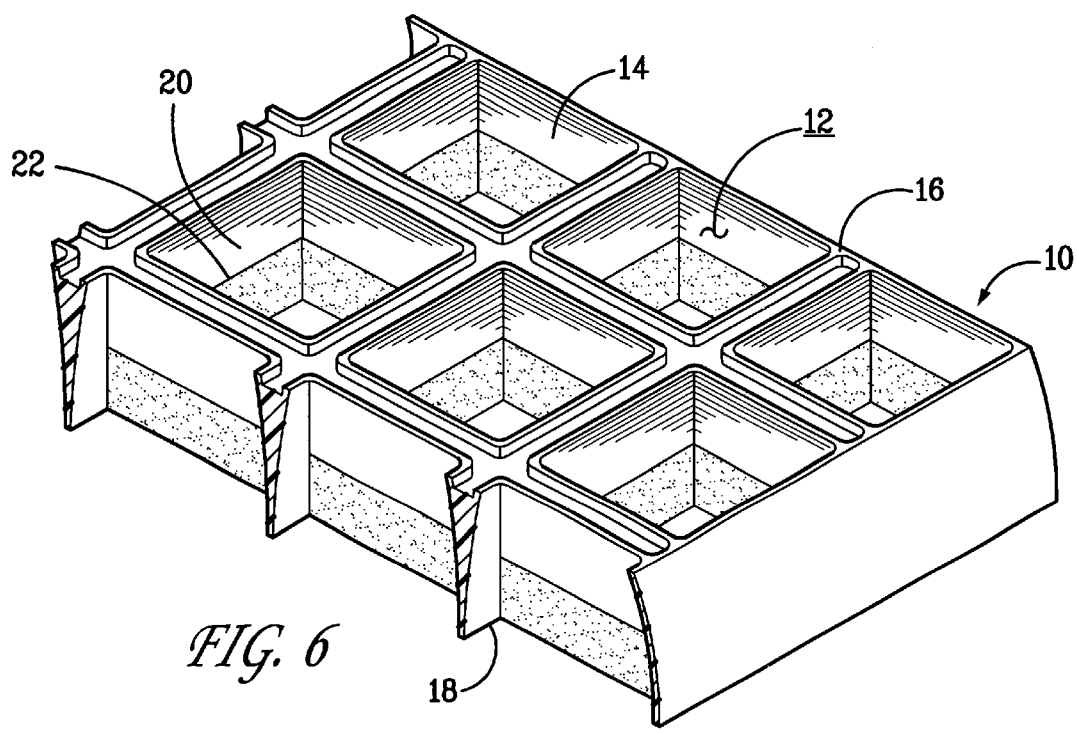
FIG. 6 is a cross-sectional and perspective view of a collimator according to yet another embodiment of the present invention.

FIG. 6 shows a cross-sectional view of yet another collimator which can be used in accordance with the methods of the invention. Collimator 10 also has a plurality of cells 12 defined by flat surfaces 14 extending through faces 16, 18. The flat surfaces 14 are substantially perpendicular to faces 16, 18. In this embodiment, the flat surfaces 14 of the cells 12 have a first portion 20 that is reflective, such as, for example, a mirror, and a second portion 22 that is substantially non-reflective, as described above. Preferably, the first portion 20 and the second portion 22 each cover about fifty percent of surface 14. It is preferred that the first portion 20 is positioned between the radiation source and the second portion 22 such that the second portion 22 is closest to the photocurable material.

In operation, radiation entering the cell 12 and striking the first portion 20 is intensified by the reflective nature of the first portion 20 as it travels from one side of the cell to another. At least a portion of the intensified radiation will be absorbed by the second portion 22, however, relative to the embodiments described in FIGS. 2 and 4, the overall intensity of the radiation will be increased, thereby decreasing the time necessary to form the latent relief image.

In a preferred method of the present invention, at least two collimators are positioned between a photographic negative and an actinic radiation source. Preferably, the cell outlet openings of each collimator have different areas. If the surfaces of the cells are wedge-shaped or curved, it is especially preferred to position the collimator having the largest cell outlet opening closest to the radiation source with each successive collimator having successfully smaller cell outlet openings. It is particularly preferred to use two collimators in series, with each collimator having square cell openings and flat cell surfaces. The collimator closer to the radiation source has the larger cell openings, preferably measuring from 1 to 4 inches on a side, while the other collimator has cell outlet openings preferably measuring from ¼ to 1 inch on a side.

Figure 7:
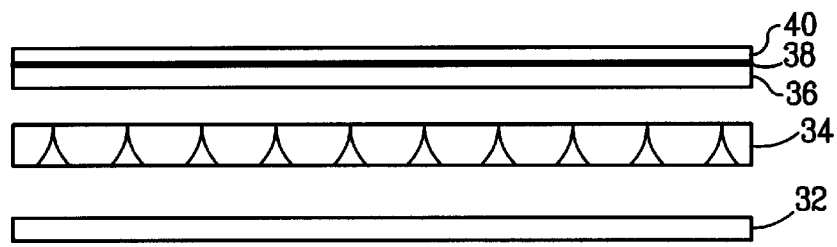
FIG. 7 is a schematic, cross-sectional view of components of an apparatus in accordance with the present invention.

Preferred components of a photoexposure apparatus of the invention are shown in cross-section in FIG. 7. The apparatus 30 contains an exposure lamp system 32 comprising an array of elongated lamps. Generally, the lamps are tubular, ultraviolet-emitting lamps which are arranged in parallel. Situated adjacent to the lamps is a collimator 34. For illustration, collimator 34 is shown to have a flat, wedge-shaped surface. The smaller cell opening faces lamps 32. Collimator 34 is in spaced relation to lamps 32, preferably with the distance between the bottom surface of the collimator and the central axes of the lamps 32 in the range of about 3 to 5 inches. Positioned above collimator 34 is a glass support plate 36 having on its upper surface a photographic negative 38 and a layer 40 of photocurable material.

Figure 8:
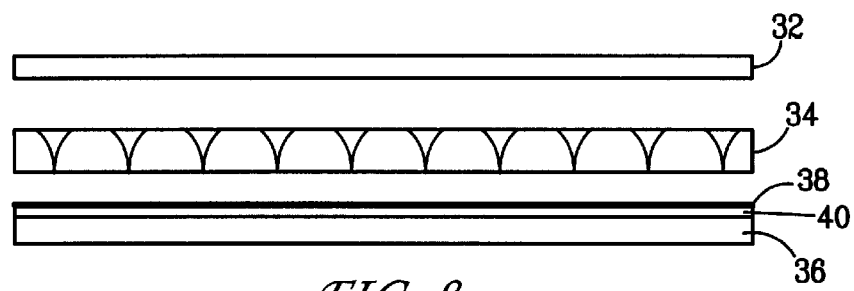
FIG. 8 is a schematic, cross-sectional view of an alternative apparatus in accordance with the present invention.
Figure 9:
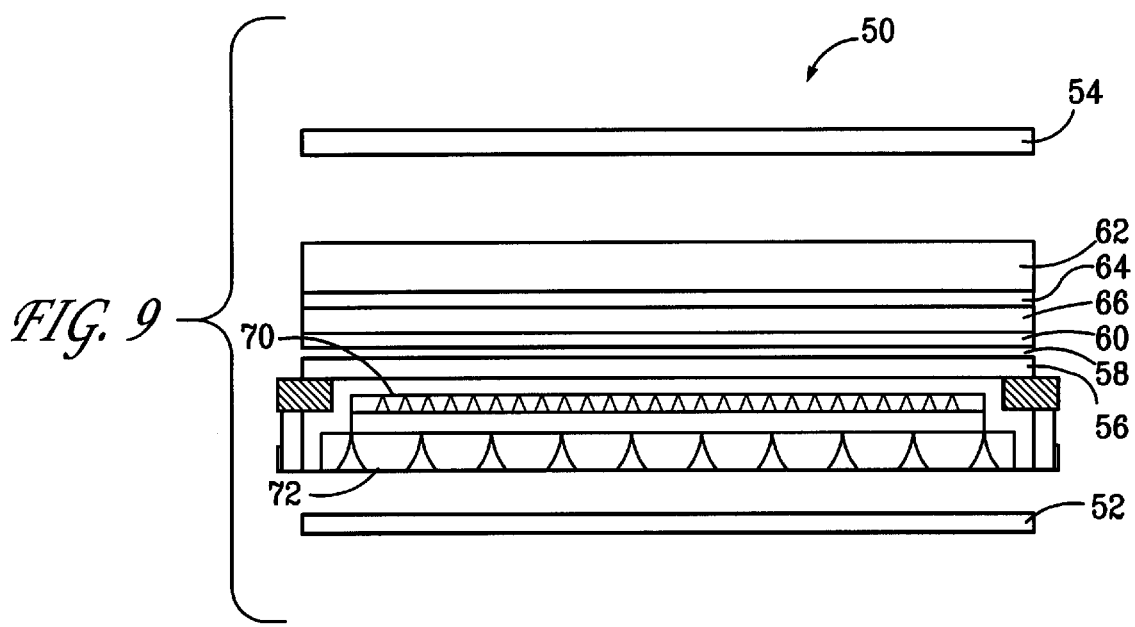
FIG. 9 is a schematic, cross-sectional view of an apparatus used in accordance with the present inventions adapted for the photoexposure of liquid photocurable materials.

As illustrated by FIGS. 7–9, the collimator (or collimators) used in the invention are positioned parallel to the photographic negative 38 which, in turn, is adjacent to the photocurable layer 40. The collimator 34 is displaced from the negative a distance sufficient to avoid casting a shadow through the negative and onto the photocurable layer 40 which will form a corresponding grid pattern in the relief image. It is desirable, however, to place the collimator 34 as close as possible to the photographic negative 38 in order to minimize the distance between the radiation source and the photocurable layer. It has been found that the collimator 34 can be positioned at relatively close distances to the photocurable layer 40, where a discernible shadow pattern is cast onto the photocurable layer 40, without development of the pattern in the relief image. The exact minimum distance can be determined empirically and will depend on the collimator or combination of collimators which is used and, to a lesser extent, on the photocurable material and exposure dose. Certain preferred collimator systems, further described hereinafter, can be satisfactorily placed as close as 1¼ inches from the surface of the photocurable layer without development of the shadow pattern in the relief image.

The term "photocurable material" refers to any solid or liquid material or composition which undergoes polymerization, cross-linking, or any other curing or hardening reaction in response to actinic radiation, usually ultraviolet radiation, with the result that the unexposed portions of the material can be selectively separated and removed from the exposed (cured) portions to form a three dimensional or relief pattern of cured material. As used herein, the term "latent relief image" refers to a cured but undeveloped image in a photocurable layer. The separation and removal of the unexposed portions can be accomplished using a jet of air ("air knife"), brushing, selective solubilization or dispersion in a suitable developer solvent or detergent solution, a squeegee, a combination of the foregoing, or other suitable development means known to those skilled in the art. A wide variety of photocurable materials are known in the art and any of these can be used in the present invention. The layer of photocurable material used to form the relief image has a depth of at least from about 0.025 inches to about 0.275 inches, and is curable throughout.

An alternative embodiment of the apparatus of the invention is shown in FIG. 8, wherein like numerals refer to the like elements of FIG. 7. In FIG. 8, the elements are arranged differently in that photographic negative 38 is positioned opposite the photocurable layer 40 from support 36. Photographic negative 38 can be in contact with the surface of layer 40, as shown, or it can be closely spaced from the surface with an air gap or thin protective layer. Such protective layers and their use are well known in the art.

Where the negative and photocurable layer are spaced apart, the distance between them is preferably less than 0.01 inch, more preferably less than 0.005 inch. The negative can be placed in direct contact with photocurable layers having dry, non-tacky surfaces, such that the negative is not damaged in use or when stripped from the layer after exposure.

One preferred embodiment of an apparatus for use in the methods of the present invention which is used for the photoexposure of liquid photopolymers is illustrated in FIG. 9.

As shown, the preferred embodiment is a commercially available Polyfibron LF 3050 plate making system fitted with a pair of collimators in accordance with the present invention. Similar machines available from other manufacturers can also be manufactured or retrofitted in accordance with the present invention.

Figure 11:
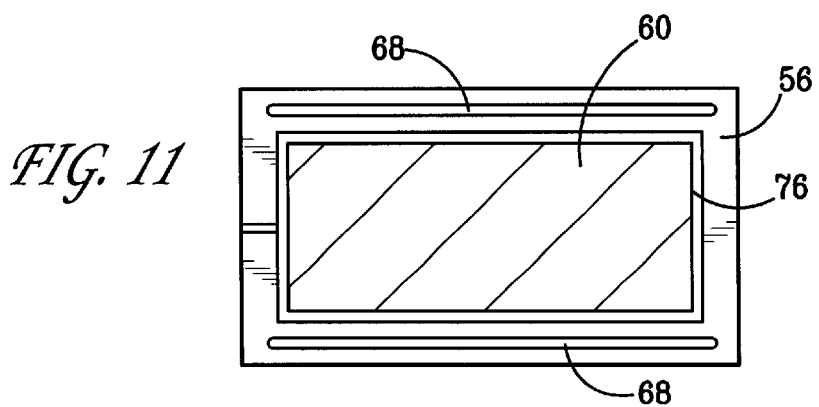
FIG. 11 is a plan view of the image exposure plate which is a part of the apparatus depicted in FIG. 9.

The apparatus 50 includes a pair of elongated ultraviolet lamp system 52 and 54. In the Polyfibron LF 3050 plate making system eighteen sixty inch long fluorescent ultraviolet lamps with a broad spectrum 300–400 nanometer emission are used as the exposure radiation source of lamp system 52. The back exposure lamp system 54 consists of nine of the same type lamps used from image exposure. Both low output and high output lamps with or without built-in reflectors and with or without filters, however, can be used. A transparent image exposure plate 56 is designed to support a photographic negative 58 on one surface. The image exposure plate 56 is a one inch thick pyrex glass plate having a 30 inch by 48 inch imaging area. The image exposure plate is horizontal and accommodates photographic negative 58 or other type of phototool on its top surface which has a matte finish. A vacuum track boundary acts to pull a cover sheet 60 over the negative 58. See vacuum track 76 in FIG. 11. A second glass plate 62 serves as the back exposure plate and is arranged parallel to and aligned with the image exposure plate 56. Like image exposure plate 56, the back exposure plate 62 has a matte finish on one surface (the lower surface in FIG. 9) and is further provided with a boundary vacuum track (not shown) identical to that of FIG. 11. The boundary vacuum track serves to secure a backing sheet 64 which contacts the photocurable layer 66.

In operation, the image exposure plate 56 is set to the height required to produce the desired thickness printing plate. The photographic negative 58 is then placed emulsion side up on the top surface of the image exposure plate 56 and a cover sheet 60 is drawn over the negative and vacuum applied to hold it flush against the image exposure plate 56, surrounding the periphery of photographic negative 58. The system includes a dispense system (not shown) which dispenses and doctors a liquid photocurable material over the cover sheet 60 to a selected thickness to provide layer 66. After the liquid layer 66 is spread, the backing sheet 64 is rolled (or drawn) over the top surface of the liquid photocurable layer 66. Subsequently, the back exposure plate 62 is lowered to come to rest on the tolerance bars 68 (see FIG. 11) thereby flattening the liquid photocurable material into a high tolerance layer 66, typically within about 0.001 inch of the intended thickness. Vacuum is applied to draw the backing sheet 64 against the back exposure plate 62. Backing sheet 64 becomes permanently adhered to the photocured layer and thus effectively serves as a support in the relief image plate which is produced.

Figure 10:
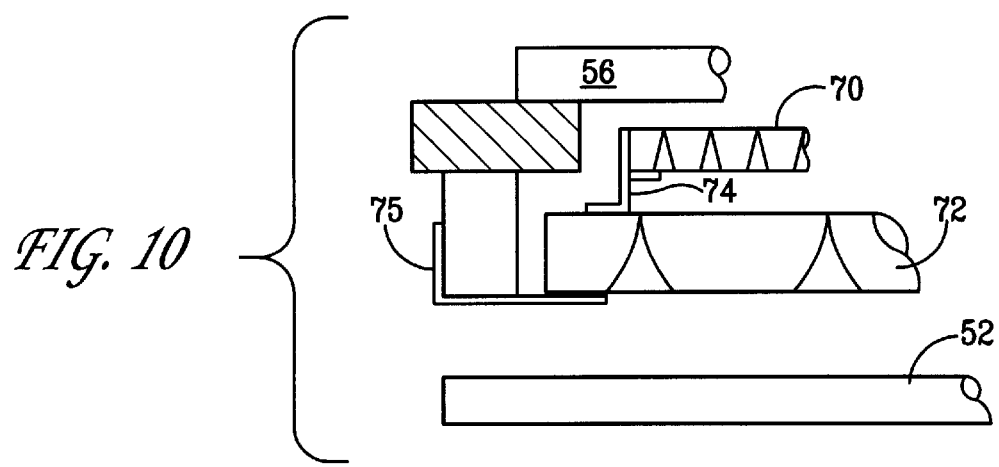
FIG. 10 is a magnified cross-sectional view of the end section depicted in FIG. 9.

As shown in FIG. 10, collimators 70 and 72 are interposed between the image exposure lamps 52 and the image exposure plate 56 in a spaced relationship. The collimators 70 and 72 are supported at each end by brackets 74 and 75. Collimators 70 and 72 have square cells and flat surfaces perpendicular to a horizontal plane defined by the image exposure plate 56. The collimators have approximately the same planar dimensions as the photocurable layer. Collimator 72 has larger cell openings than collimator 70. Preferably, the largest cell collimator is placed closest to an actinic radiation source to attain optimal image fidelity and resolution. Preferably the cell outlet area of collimator 72 is at least 50% larger than the cell outlet area of collimator 70. In a particularly preferred combination, collimator 72 consists of a plurality of square cells which are 1½ inches on a side at the outlet opening and collimator 70 consists of a plurality of square cells which are ½ inch on a side at the outlet opening. Preferably, these collimators have depth dimensions of 1 inch and ½ inch, respectively. The optimal distances between the lamps, collimators, and photocurable layer can be determined empirically. It is preferred, however, that the collimator closest to the photocurable layer be sufficiently removed from the layer to avoid casting a shadow onto the layer which forms a corresponding grid pattern in the relief image.

Referring to the apparatus of FIG. 9, the collimator 70 can be positioned at a relatively minimal distance, e.g., at about 1½ inches, from the photocurable layer without imaging the grid pattern. The distances between the collimators 70 and 72 and between the collimator 72 and the lamps 52 can also be kept to a relative minimum, e.g., about 1 to 3 inches in each case, such that the distance between the lamps and the photocurable layer is approximately the same as in the conventional photo-imaging unit. This minimal spacing between the lamps and the photocurable layer is highly preferred to use the actinic radiation emitted by the lamps most efficiently. In a preferred embodiment of the apparatus of FIG. 9, the distance from the central axis of lamps 52 and to the top surface of exposure plate 56 is from about 0.5 to about 3.0 inches, preferably from about 2.5 to about 3.0 inches. In this embodiment, collimator 72 comprises 1.5 inch square cells having flat surfaces and a depth of 1 inch, and is positioned at a distance of 3.125 inches from its bottom surface to the central axis of lamps 52. Collimator 70 comprises 0.5 inch square cells having flat surfaces and a depth of 0.5 inches, and is positioned such that its bottom surface is 1 inch from the top surface of collimator 72. The top surface of collimator 70 is 0.5 inches from the bottom surface of exposure plate 56. Although collimator 70 is only 1.5 inches from the photocurable layer and the collimator combination casts a discernible shadow onto surfaces at that distance, the shadow grid pattern is not developed in the relief image.

The image exposure plate 56 is generally transparent to the radiation employed to cure or harden the photocurable composition. The back exposure plate 62 can also be transparent to such radiation to allow the photocurable layer to be back exposed, thereby forming a hardened polymer layer which serves as a base of the relief image. The back exposure is generally an overall, non-imagewise exposure, although it can be imagewise if desired. After exposure of the photocurable material, the vacuums are released, the back exposure plate 62 is raised, and the imaged plate is removed with the cover sheet 60 and backing sheet 64 in place. Cover sheet 60 is removed, while backing sheet 64 remains permanently adhered to the photocured layer. The uncured liquid photocurable material is then removed using an air knife, developer solvent, or other means. After development, the plate is generally subjected to a further overall exposure to further cure the relief.

The cover sheet 60 is typically a polypropylene film 0.001 inches thick which is drawn over the negative imaging area and vacuumed down to form a barrier interface to the liquid photopolymer. Use of the cover sheet 60 allows negative 58 or other phototool to be reused indefinitely.

In the presently preferred embodiment the backing sheet 64 is a polyester film of 0.005 inch thickness. The backing sheet is deployed by a laminator device which rolls the backing film onto the top surface of the liquid photocurable material and also rolls out excess material.

As indicated above, the exposure method of the invention can provide significantly improved high resolution relief images and, in particular, an exposure of the photocurable layer which simultaneously forms desired highlight dots and shadow reverses in half-tone reliefs. In addition, the method can provide a broadened latitude in exposure doses which can be used to provide this performance.

Additional objects, advantages, and novel features of this invention will become apparent to those skilled in the art upon examination of the following examples thereof, which are not intended to be limiting.

EXAMPLES

Solid Photopolymer Plates—Image Enhancement Technique

Imaging

FLEXLIGHT HSE 0.067, a commercial photopolymer flexographic plate material available from Polyfibron Technologies, Atlanta, Ga., was placed on an imaging platen of FLEXLIGHT 3647 Exposure Unit, a commercial exposure unit also available from Polyfibron, with the non-removable polyester placed in the direction of the back exposure bulbs for plate floor development. After lowering the lid, the photopolymer material was back exposed. After the back exposure, the lid was raised and the photopolymer material was turned over and the removable coversheet was peeled off. At that time, an imaging film was placed, projected or engraved on the photosensitive polymer plate surface. Then a 18"×20" black collimator having 0.5"×0.5"×0.5" cells with wall of about 0.017 inches thick was suspended between the UV-lamps and the exposure platen by placing it on four one-inch metal blocks, one block at each corner. This suspended the bottom of the collimator about one-inch above the exposure platen and the top of the collimator was about 0.90 inches below the exposure bulbs. The lid was lowered and the lamps were turned on. The majority of the UV-light rays reaching the plate were perpendicular to the plane of the plate. For sheet polymer exposure units that have both top and bottom exposure bulbs, the collimator panel can be suspended above the exposure platen and used in the same manner as the bank lamp exposure unit.

Processing

The cured photopolymer plate was placed in a FLEXLIGHT 5280 Plate Processor, a commercial processing unit available from Polyfibron Technologies, Atlanta, Ga., where the unexposed photopolymer resin was removed by brush agitation and commercial plate wash solvent such as, for example, SOLVIT Processing Solution (commercially available from Polyfibron Technologies, Atlanta, Ga.). After washout, the imaged plated was dried in hot circulating air for 2 hours at 140 degrees Fahrenheit. The dry plate was then post-exposed with UV-light to further through cure and surface tack.

Evaluation

The finished plate material was examined by taking cross-sectional measurements of relief lines, dots and reverses. Measurements showed that the plate imaged through the diffuser panel had sharper lines, pointed dots and deeper reverses than the conventional plate imaged with the same film.

Liquid Photopolymer Plates—Image Enhancement Technique

Imaging

LETTERFLEX 150SP, a commercial liquid photopolymer plate making unit from Polyfibron Technologies, Atlanta, Ga., was used. A 15"×18" black collimator panel having cell walls with a thickness of about 0.067 inches having a plurality of 0.5"×0.5"×0.5" cells with flat, non-reflective surfaces substantially perpendicular to a plane defined by the lamps was suspended between the lower glass and the UV-exposure lamps such that the top of the collimator was about 0.50 inches below the bottom of the glass. An image-bearing negative was placed on the topside of the exposure platen and the clear polyethylene film was pulled over the film as a protective barrier between the glass and polymer.

Vacuum pressure was induced to provide intimate contact between the film and the glass. After a thin layer of photosensitive liquid photopolymer was cast over the film, the layer of resin was laminated with a polyester clear mylar layer for a support. The top glass housing that containing the plate back exposure UV-lamps was lowered onto a fixed shim for the desired plate thickness. The back exposure was completed by illuminating the top lamps for about 50 seconds. Then the face exposure bulbs were illuminated, transmitting UV-light through the collimator panel into the clear glass to cure the resin above the film (about 15 minutes). The intensity of the actinic radiation was about 1.05 mW/cm$^2$. Even though some light can scatter trough the glass, the majority of the light propagates through the glass perpendicularly.

Processing

The imaged plate was washed in a Merigraph Rotary washout unit with FLEXOWASH X-100, a commercial platewash detergent available from Polyfibron Technologies, Atlanta, Ga.). Then the plate is post exposed for further through cure and surface detack. The plate was then dried in a hot circulating air oven at 120 degrees Fahrenheit.

Evaluation

The finished plate material was examined by taking cross-section measurement of relief lines, dots and reverses. Measurements showed that the plate imaged through the diffuser panel had sharper lines, pointed dots and deeper reverses than the conventional plate imaged with the same film.

COMPARATIVE EXAMPLES

Comparative Example 1

Referring to Table 1, nine 0.067 inch liquid photopolymer plates were made according to the method of the present invention as described above (Collimator). For comparison, an additional nine liquid photopolymer plates were made according to the procedure described above without the collimator (Standard). In the latter procedure, a yellow filter was placed between the lower glass and the bulbs to reduce the UV intensity to the level experienced by the collimator-exposed plates. Three plates for each exposure technique were made for exposure at 13, 15, and 17 minutes at a UV intensity of about 1.05 mW/cm$^2$. A series of measurements familiar to those skilled in the art, such as, for example, shoulder width and reverse depth were made to evaluate the two exposure techniques. Review of the data summarized in Table 1 shows that there is a significant improvement in the reverse depth, shoulder sharpness, and dot sharpness for the plates made utilizing the collimator according to one embodiment of the present invention. Deeper reverses and sharper dots contribute to a plate's overall print quality.

Comparative Example 2

Three EPIC 0.045 PRX plates were prepared in a FLEXLIGHT 3647 plate making system. The first plate was made with a collimator according to the present invention. The second plate was made using the prior art reflective collimator. Finally, the third plate was made via the conventional technique as described in comparative Example 1. The collimators were positioned about 0.96" above the plate and size of the cells on the collimators used was 0.5"×0.5"×0.5". The intensity of the UV lamp was 16.0 mW/cm2. A series of measurements familiar to those skilled in the art, such as, for example, shoulder width and reverse depth were made to evaluate the two exposure techniques. The data is summarized in Table 2.

Review of the data shows that the reverses are deeper, the line widths are narrower, and the highlight dots are sharper for the plates made utilizing the non-reflective collimator as compared to the plate made with a reflective collimator or the plate made according to a conventional plate making technique. Deeper reverses and sharper dots contribute to a plate's overall print quality.

Those skilled in the art will appreciate that numerous changes and modifications can be made to the preferred embodiments of the invention and that such changes and modifications can be made without departing from the spirit of the invention. It is therefore intended that the appended claims cover all such equivalent variations as fall within the true spirit and scope of the invention.

TABLE 1

Comparative Plate Measurements - Non-Reflective Grid vs. Conventional Method

| Rows | Type | FEX Time | 30 mil Reverse | 15 mil Reverse | 15 mil Line | 15 mil Shoulder | 3% 133 Width | 3% 133 Shoulder | 3% 133 Width | 3% 100 Shoulder | 3% 133 Depth |
|---|---|---|---|---|---|---|---|---|---|---|---|
| 1 | Grid | 13 | 18.30 | 8.20 | 14.05 | 19.30 | 1.20 | 7.90 | 1.80 | 8.90 | 18.00 |
| 2 | Grid | 13 | 19.50 | 8.20 | 14.35 | 18.40 | 1.30 | 7.30 | 1.75 | 8.50 | 22.00 |
| 3 | Grid | 13 | 19.20 | 7.50 | 14.20 | 18.90 | 1.35 | 7.00 | 1.90 | 8.90 | x |
| 4 | Grid | 15 | 17.85 | 7.20 | 14.25 | 19.70 | 1.60 | 6.50 | 1.95 | 8.00 | 18.00 |
| 5 | Grid | 15 | 17.40 | 8.40 | 14.20 | 17.70 | 1.00 | 7.90 | 1.70 | 8.20 | 24.00 |
| 6 | Grid | 15 | 19.00 | 9.00 | 14.90 | 17.70 | 1.25 | 6.55 | 1.85 | 8.40 | 24.00 |
| 7 | Grid | 17 | 16.80 | 8.60 | 14.00 | 18.50 | 1.55 | 6.40 | 1.95 | 9.20 | 20.00 |
| 8 | Grid | 17 | 17.75 | 8.10 | 14.30 | 19.20 | 1.50 | 7.80 | 2.05 | 8.15 | 20.00 |
| 9 | Grid | 17 | 19.45 | 9.40 | 14.25 | 17.85 | x | x | 1.85 | 8.60 | 20.00 |
| 10 | Standard | 13 | 10.05 | 4.30 | 14.40 | 21.60 | 1.75 | 4.80 | 2.40 | x | 8.00 |
| 11 | Standard | 13 | 15.00 | 6.80 | 14.40 | 20.20 | 1.50 | 5.00 | 2.25 | 6.90 | 10.00 |
| 12 | Standard | 13 | 11.60 | 5.05 | x | x | 2.16 | 3.85 | 2.45 | 6.20 | 10.00 |
| 13 | Standard | 15 | 11.70 | 6.50 | 14.80 | 21.50 | 2.30 | x | 2.60 | x | 16.00 |
| 14 | Standard | 15 | 10.20 | 6.60 | 14.90 | 20.85 | 2.15 | x | 2.60 | x | 14.00 |
| 15 | Standard | 15 | 11.20 | 6.60 | 14.90 | 21.40 | 2.20 | x | 2.60 | x | 18.00 |
| 16 | Standard | 17 | 8.00 | 3.94 | 14.90 | 23.50 | 2.90 | 5.40 | 2.90 | 6.05 | 8.00 |
| 17 | Standard | 17 | 12.60 | 6.50 | 14.30 | 21.00 | 2.20 | 4.70 | 3.45 | 7.00 | 10.00 |
| 18 | Standard | 17 | 10.60 | 5.60 | 14.10 | 21.10 | 2.60 | 6.25 | 3.00 | 4.50 | 10.00 |

Plate material is LETTERFLEX 150SP liquid photopolymer
* = All numbers represent 0.0001 inches
x = data unavailable

TABLE 2

Comparative Plate Measurements - Non-Reflective Grid vs. Reflective Grid

| | 30 Reverse | 15 Reverse | 15 Line | 2% 150 |
|---|---|---|---|---|
| Non-Reflective Collimator | 15.0 | 8.1 | 14.9/19.4 | 1.40/5.50 |
| Reflective Collimator | 11.4 | 5.90 | 15.0/21.7 | 1.60/3.50 |
| Conventional (No Collimator) | 11.0 | 5.80 | 15.4/22.3 | 1.8/3.30 |

*All numbers represent 0.001 inches
*Plate material is FLEXLIGHT HSE 0.067 sheet photopolymer

What is claimed is:

1. A method for producing relief images having high identity and resolution comprising the steps of:
   providing a collimator that has first and second opposing major faces, said collimator comprising at least one cell that extends from said first collimator face to said second collimator face and is defined by at least one surface that substantially absorbs actinic radiation incident upon said surface;
   positioning said collimator opposite a photographic negative that is adjacent a layer of photocurable material; and
   passing actinic radiation through said collimator.

2. The method of claim 1 wherein said faces of the collimator are substantially parallel.

3. The method of claim 1 wherein said collimator has a plurality of cells.

4. The method of claim 3 wherein said plurality of cells have a continuous surface.

5. The method of claim 3 wherein said plurality of cells have a multi-faceted surface.

6. The method of claim 1 wherein said surface of said at least one cell has a minimum reflectivity of about 10% or less.

7. The method of claim 6 wherein the minimum reflectivity is about 0%.

8. The method of claim 1 wherein said surface of said at least one cell is black.

9. The method of claim 1 wherein said collimator is in contact with said photographic negative.

10. The method of claim 9 wherein a distance of about 1 inch separates said collimator and photographic negative.

11. The method of claim 1 wherein said collimator is not in contact with said photographic negative.

12. The method of claim 1 wherein said actinic radiation is passed through said collimator for a time and under conditions effective to cure said photocurable material.

13. The method of claim 1 further comprising the step of removing uncured photocurable material.

14. A method for producing relief images having high fidelity and resolution comprising the steps of:
   providing a collimator that has first and second opposing major faces, said collimator comprising at least one cell that extends from said first collimator face to said second collimator face and is defined by at least one surface comprising a first portion that reflects actinic radiation and a second portion that substantially absorbs actinic radiation incident upon said surface;
   positioning said collimator opposite a photographic negative that is adjacent a layer of photocurable material; and
   passing actinic radiation through said collimator.

15. The method of claim 14 wherein said faces of the collimator are substantially parallel.

16. The method of claim 14 wherein said collimator has a plurality of cells.

17. The method of claim 16 wherein said plurality of cells have a continuous surface.

18. The method of claim 16 wherein said plurality of cells have a multi-faceted surface.

19. The method of claim 14 wherein said second portion of said surface has a minimum reflectivity of about 10% or less.

20. The method of claim 19 wherein the minimum reflectivity is about 0%.

21. The method of claim 14 wherein said first portion is a mirror.

22. The method of claim 14 wherein said collimator is in contact with said photographic negative.

23. The method of claim 14 wherein said collimator is not in contact with said photographic negative.

24. The method of claim 23 wherein a distance of about 1 inch separates said collimator and photographic negative.

25. The method of claim 14 wherein said actinic radiation is passed through said collimator for a time and under conditions effective to cure said photocurable material.

26. The method of claim 14 further comprising the step of removing uncured photocurable material.

* * * * *